United States Patent
Ilic

(10) Patent No.: US 7,443,396 B2
(45) Date of Patent: Oct. 28, 2008

(54) INSTRUMENT HAVING A VIRTUAL MAGNIFYING GLASS FOR DISPLAYING MAGNIFIED PORTIONS OF A SIGNAL WAVEFORM

(75) Inventor: Kosta Ilic, Austin, TX (US)

(73) Assignee: National Instruments Corporation, Austin, TX (US)

( * ) Notice: Subject to any disclaimer, the term of this patent is extended or adjusted under 35 U.S.C. 154(b) by 987 days.

(21) Appl. No.: 09/726,776

(22) Filed: Nov. 29, 2000

(65) Prior Publication Data

US 2002/0063712 A1     May 30, 2002

(51) Int. Cl.
*G09G 5/00* (2006.01)
(52) U.S. Cl. .................... 345/440.1; 345/440
(58) Field of Classification Search ........... 345/671, 345/815, 660, 661, 418, 419, 629, 440–440.2; 702/66–68
See application file for complete search history.

(56) References Cited

U.S. PATENT DOCUMENTS

| | | | | |
|---|---|---|---|---|
| 5,129,722 | A * | 7/1992 | Mader et al. | 356/73.1 |
| 5,434,954 | A * | 7/1995 | Kawauchi et al. | 345/440 |
| 5,491,781 | A * | 2/1996 | Gasperina | 715/786 |
| 5,519,820 | A * | 5/1996 | Kawauchi et al. | 345/440 |
| 5,579,463 | A * | 11/1996 | Takano et al. | 345/440 |
| 5,617,523 | A * | 4/1997 | Imazu et al. | 345/440 |
| 5,670,984 | A * | 9/1997 | Robertson et al. | 345/585 |
| 5,760,785 | A * | 6/1998 | Barber et al. | 345/440 |
| 5,920,317 | A * | 7/1999 | McDonald | 345/853 |
| 6,064,401 | A * | 5/2000 | Holzman et al. | 345/440 |
| 6,121,965 | A * | 9/2000 | Kenney et al. | 345/810 |
| 6,229,536 | B1 * | 5/2001 | Alexander et al. | 345/440.1 |
| 6,326,987 | B2 * | 12/2001 | Alexander | 345/771 |
| 6,642,936 | B1 * | 11/2003 | Engholm et al. | 345/661 |
| 6,938,218 | B1 * | 8/2005 | Rosen | 715/850 |

OTHER PUBLICATIONS

Kline et al., Improving GUI Accessibility for People with Low Vision, May 1995, ACM, Conference proceedings on Human factors in computing systems, pp. 1-11.*

* cited by examiner

*Primary Examiner*—Chante Harrison
(74) *Attorney, Agent, or Firm*—Meyertons Hood Kivlin Kowert & Goetzel, P.C.; Jeffrey C. Hood

(57) ABSTRACT

An electronic instrument which has a virtual magnifying symbol capable of magnifying a portion of the instrument's signal waveform in a single window of the instrument display. The user is able to position the virtual magnifying symbol with knobs, buttons, or, more preferably, with a pointer, such as a mouse, digital pen, or touch screen. The virtual magnifying symbol can be employed at all times during display of the signal waveform. In the preferred embodiment, the virtual magnifying symbol is a magnifying glass. The user centers the desired portion of the signal waveform within the virtual lens of the magnifying glass, then magnifies the desired portion. Thus the instrument with the virtual magnifying glass of the present invention provides an innovative solution for simultaneously magnifying a portion of the instrument's signal waveform within the context of the entire signal waveform. Viewing, within the context of the entire signal waveform, a portion of that waveform allows the user to operate the instrument more efficiently and accurately.

25 Claims, 5 Drawing Sheets

INSTRUMENT HAVING A VIRTUAL MAGNIFYING GLASS FOR DISPLAYING MAGNIFIED PORTIONS OF A SIGNAL WAVEFORM

FIELD OF THE INVENTION

The present invention relates to electronic test and measurement instruments, and more specifically to the display of the visual output data from such instruments and partial magnification thereof.

DESCRIPTION OF THE RELATED ART

An instrument may be defined as a device which collects data or information from an environment or unit under test and analyzes and/or displays this information to a user. For example, an instrument may perform various data analysis and data processing on acquired data prior to displaying the data to the user. Examples of various types of instruments include oscilloscopes, digital multimeters, spectrum analyzers, computer-based measurement systems or virtual instruments, etc., and the types of information which might be collected by respective instruments include voltage, current, resistance, distance, velocity, pressure, frequency of oscillation, humidity, temperature, image or video data, and audio data, among others.

The various instrumentation systems currently available range from traditional stand-alone instruments to more modern computer-based instruments. Within the stand-alone category are the older analog instruments and the newer digital instruments. Analog instruments were implemented over 100 years ago, but digital instruments have become more useful, and, therefore, more prevalent, because their faster data transfer times are better for measuring high-speed signals. Current stand-alone instruments have also included computer systems "in the box", thus blurring the line between traditional stand-alone instruments and more modern computer-based instruments.

In general, computer-based instruments, including virtual instruments, are rapidly becoming the instrumentation of choice because they offer three distinct benefits over stand-alone instruments: 1) setup and transfer times may be over 50 times faster with computer-based instruments than with stand-alone instruments, 2) computer-based instruments are less expensive to purchase and maintain, and they require less space than stand-alone instruments, and 3) computer-based instruments are modular and simplify system integration that is difficult with stand-alone instruments. Nonetheless, stand-alone instruments provide features characteristic of a device designed specifically for test and measurement functions, such as specialized input ports allowing a direct connection to the system or environment under test.

Of the many different electronic test instruments, the oscilloscope is the most useful and versatile, and remains the primary engineering and research tool to study and measure signal waveforms acquired from a system under test. Moreover, in addition to being used as simple viewing tools of signal waveforms, oscilloscope functions now routinely displace/replace many traditional instruments such as DMM voltmeters, frequency counters, impedance analyzers, power meters, spectrum analyzers, and time interval analyzers. Thus, the oscilloscope will be used as the example instrument.

In displaying a signal waveform on a display, often a user finds it advantageous to choose a time length which displays a relatively large period of time, thus permitting the user to observe the primary characteristics of the waveform. However, when the entire captured waveform is displayed on the display, the features of the waveform may be drawn so closely together that these features may be difficult to distinguish on visual examination. The density of the waveform as displayed may be such that the user cannot conveniently use cursor or marker functions which are commonly found on oscilloscopes for measuring the magnitude of the waveform at particular points on the waveform. Thus, after observing the waveform at the original resolution, the user often desires to observe a portion of the displayed waveform at a higher resolution (magnified), and make observations or measurements of the waveform which are more accurate because of the higher resolution of the display. Measurements made on the waveform under test (based on the displayed points) will be more accurate because the higher resolution of the display allows more signal points to be displayed.

One way in which the user may magnify the waveform is to display only a portion of the full waveform on the display at any one time, thereby horizontally expanding the time base for the displayed waveform and more fully separating the data points that are displayed. However, this method of magnification will cause the user to lose the context of the location of the magnified portion of the waveform in the original waveform. An oscilloscope typically has only one display screen that displays a signal waveform in response to user input. Thus, some oscilloscopes allow the user to zoom in on a portion of the displayed waveform, but at the expense of not being able to simultaneously view the entire waveform. While it is useful to view magnified portions of a waveform, most users would find it preferable to view the magnified portion within the context of the entire waveform. This would allow the user to pinpoint the place on the original waveform where certain characteristics, identified in the magnified portion, exist.

Other oscilloscopes feature a single display with multiple windows or grids, allowing the user to view multiple waveforms, or if desired, multiple views of the same waveform. FIG. 1 illustrates the multi-view display according to the prior art, wherein the display comprises two separate windows labeled FIG. 1a and FIG. 1b. Thus, the user can select a portion of the waveform (in FIG. 1a) and simultaneously display a magnified view of this selected portion in a separate window or grid (FIG. 1b). However, users may find visually switching between two waveforms disruptive, thereby minimizing the user's ability to view the magnified portion within the context of the entire waveform. Hence this approach does not alleviate the problem stated above, where the user loses track of where on the original waveform the magnified portion being viewed is located. U.S. Pat. No. 4,975,636 to Desautels illustrates this approach. Desautels teaches a method permitting a user "to display a waveform under test at a first user-determined resolution, and to concurrently select and display a subsection of the displayed waveform on a second display at a second user-determined resolution higher than the first resolution . . . " (emphasis added). The stated purpose of Desautels is to allow the user to observe two displays at different resolutions, but which are derived from the same data.

Another example of the current art is U.S. Pat. No. 5,039,937 to Mandt, which discloses simultaneously displaying two waveforms, these being "a scroll bar waveform which is an abstracted representation of the full waveform data stored in memory and a generally expanded portion of the full waveform data in the memory." The user can select a portion of the abstracted waveform to be expanded by positioning a set of cursor brackets around the desired portion. The user "can move the brackets to change the width or the position of the expanded portion of the waveform that is shown on the screen." But, once again, the user loses the context of the original waveform by having to view two separate versions of the same waveform.

Whether the oscilloscope is analog, digital, or computer-based, typical user input options that result in magnifying a portion of the waveform include varying the gain and sweep settings, adjusting zoom controls, and adjusting horizontal magnification settings. Despite these and many other functions, oscilloscopes tend to be under-utilized. One reason for this are the non-standard user interfaces, including the different means for magnifying portions of a waveform. Therefore, it would generally be desirable to unify the different user interfaces for waveform magnification so that oscilloscopes and other test instruments will be used more efficiently. The present invention achieves this desired result in addition to allowing the user to view magnified portions within the context of the entire waveform.

SUMMARY OF THE INVENTION

One embodiment of the present invention comprises an electronic instrument which has a visual output display including a virtual magnifying symbol or icon. The instrument includes a method of using the virtual magnifying symbol or icon to zoom in on portions of the signal waveform or other signal data displayed on the instrument's display screen. The virtual magnifying symbol or icon can be adapted for use on any type of instrument, including analog, digital, and computer-based instruments.

In the preferred embodiment, the virtual magnifying symbol or icon has the appearance of a virtual magnifying glass (VMG). This configuration is most useful because the magnifying glass best represents the action of magnification. Also, the circular design of the magnifying lens defines an efficient area wherein the user may focus magnification efforts. In other embodiments, the region of the virtual magnifying symbol may have other shapes, as desired.

In the preferred embodiment, the virtual magnifying symbol (VMS) can be moved, positioned, and employed on the display screen at any time during display of the signal waveform. Most importantly, the VMS causes a user-selected portion at a first location of the originally displayed signal waveform to be magnified, displayed, and centered proximate to the position the portion had relative to the original waveform prior to magnification. Stated another way, when the VMS is moved over a portion of the signal waveform, and a magnification feature is optionally selected, that portion of the signal waveform is magnified at its location. The magnified portion can thus be seen in its proper context within the remainder of the image, with only a relatively small portion of the remaining waveform being suppressed or occluded to make room for the magnified portion. Thus the VMS of the present invention provides an innovative solution for examining magnified portions of an instrument's signal waveform while using a single waveform. In other words, the present invention eliminates the need for multiple views or windows of the waveform, or the need to use the entire display for the display of the zoomed portion. Consequently, the VMS allows the user to view and analyze the output data more efficiently and accurately.

In the preferred embodiment, the instrument includes an input device or other means for moving, positioning, and employing the VMS. A pointing device, such as a mouse, digital pen, or touch screen, may be used. Other means for inputting user commands may include knobs or buttons.

One embodiment of the present invention also provides a standard mechanism for magnifying portions of signal waveforms for stand-alone instruments and computer-based instruments. Therefore the system and method may help unify the different types of user interfaces available for instrument magnification functions, and further enhance instrument efficiency.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figures 1A, 1B:
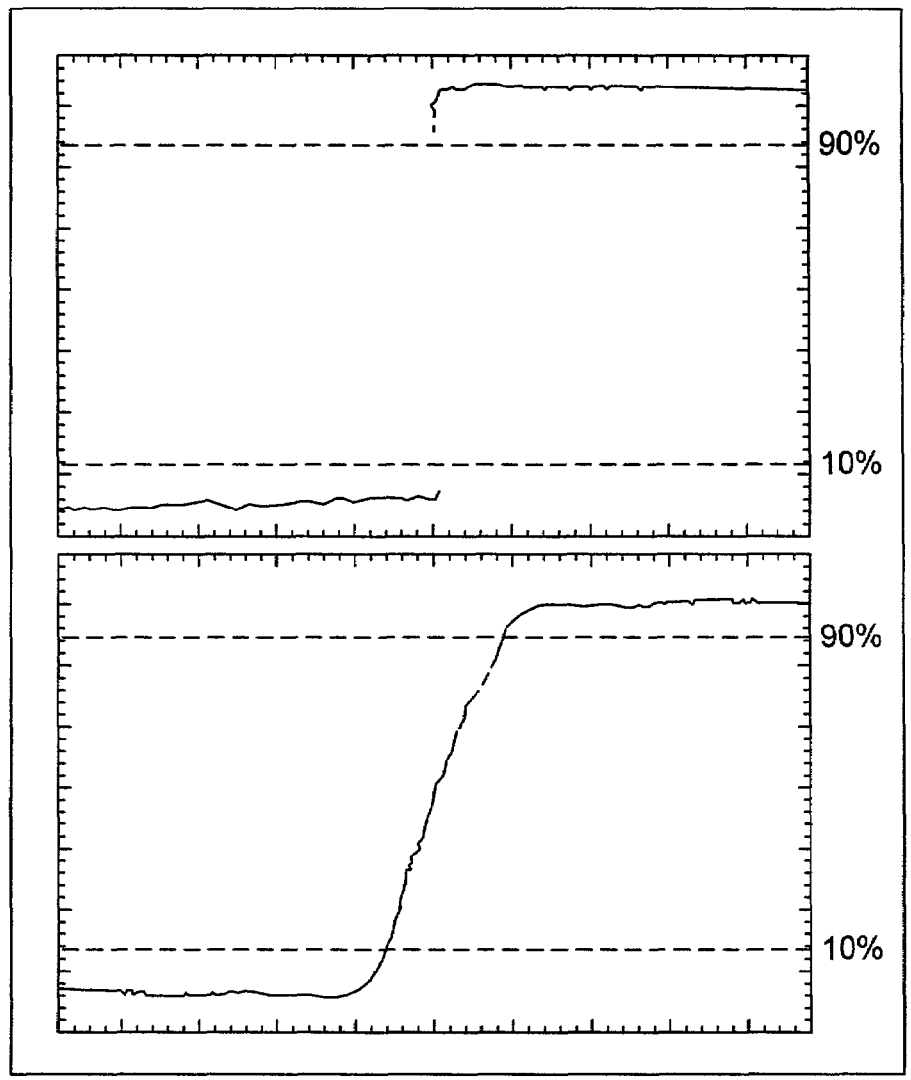
FIG. 1 illustrates a dual or split display screen with bottom view displaying a magnified portion of a waveform according to the prior art.
Figure 2:
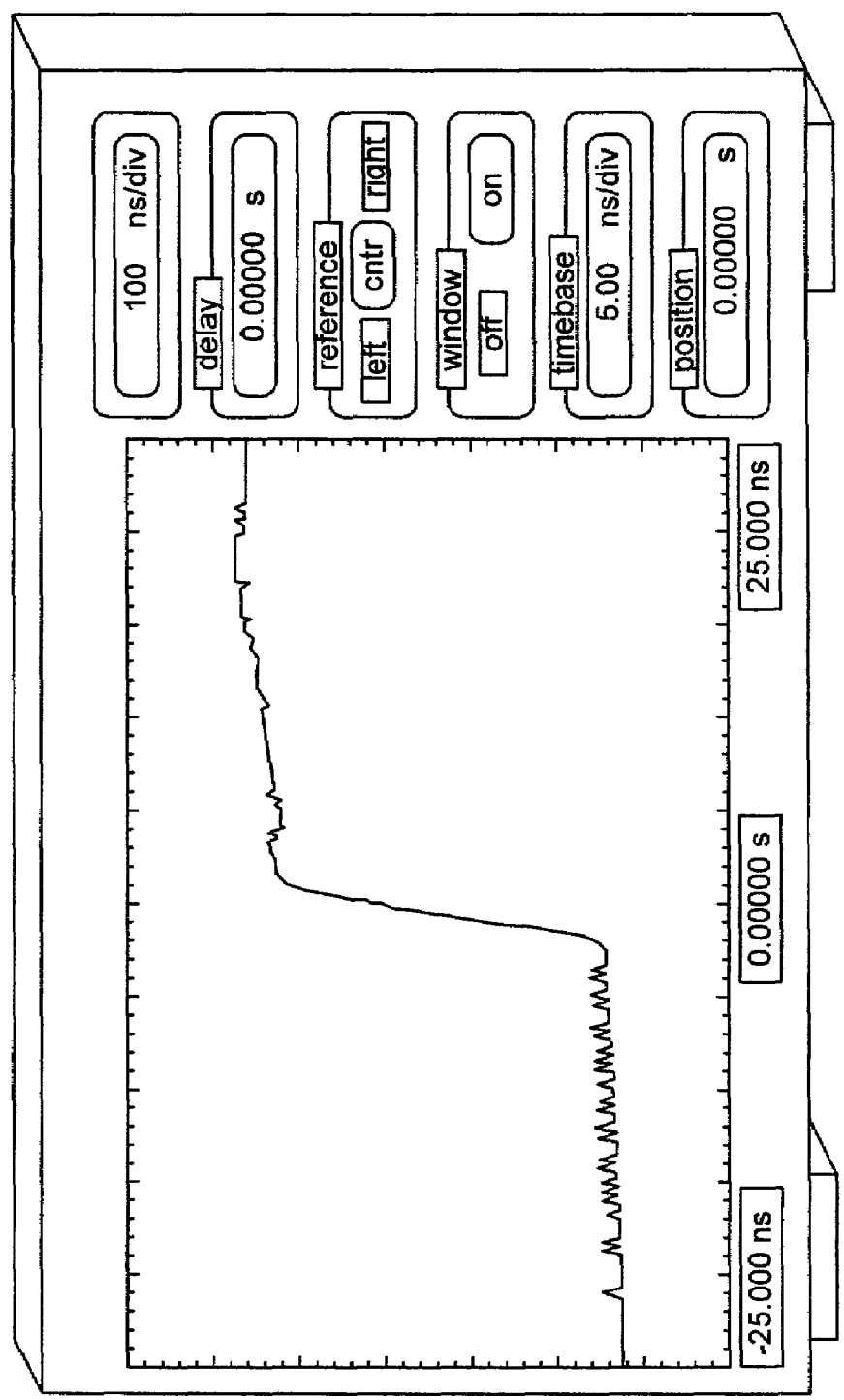
FIG. 2 illustrates a stand-alone instrument, more specifically a digital oscilloscope, with display screen, which may include one embodiment of the present invention.
Figure 3:
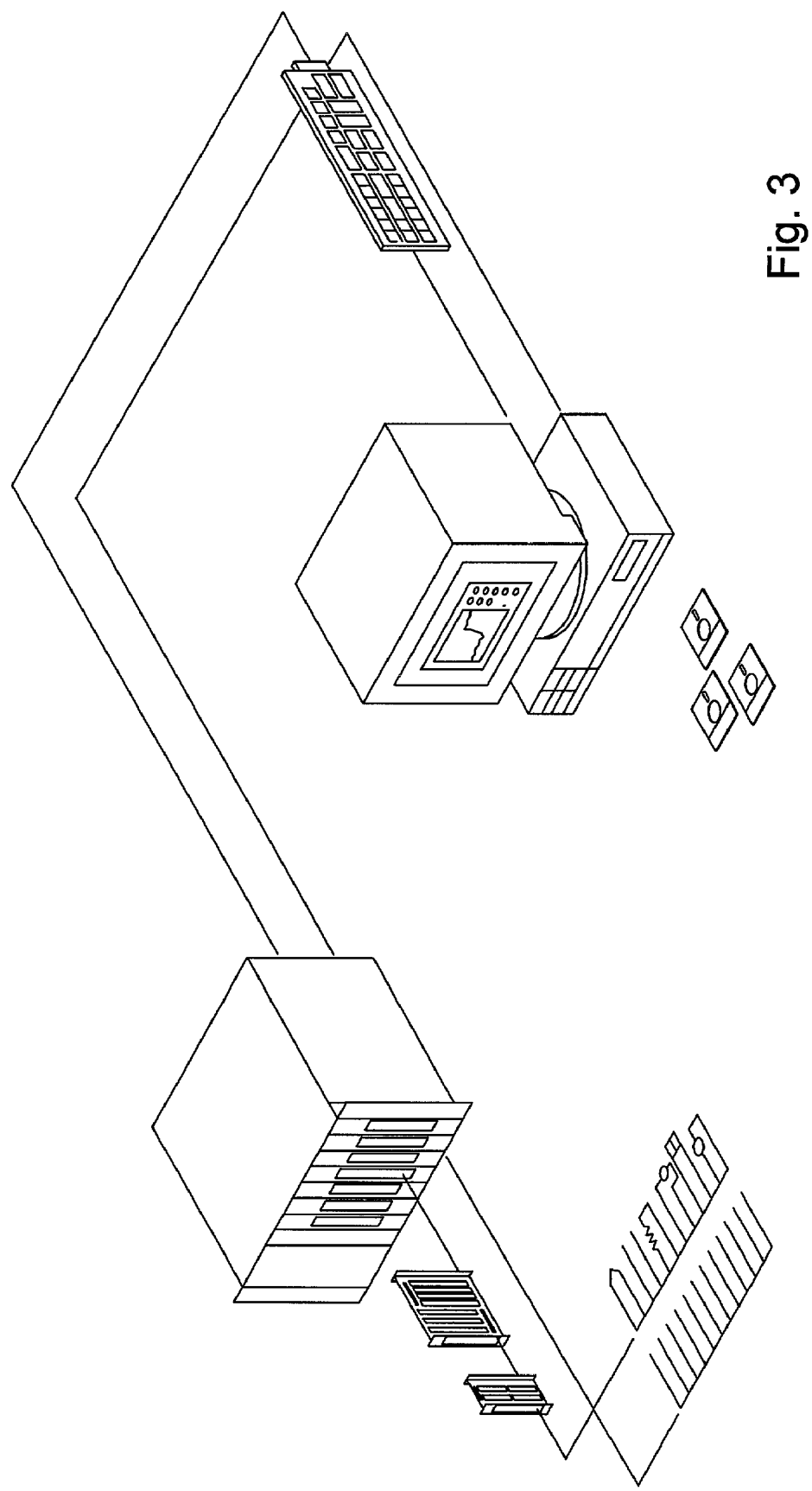
FIG. 3 illustrates a computer or PC-based measurement system or instrument, more specifically an oscilloscope, with display monitor including instrument software window.

FIGS. 2 and 3—Exemplary Instruments

FIG. 2 illustrates one embodiment of a traditional, stand-alone instrument which may include the magnification features of the present invention. FIG. 3 illustrates one embodiment of a computer-based measurement system, also called a computer-based instrument or virtual instrumentation system, which may include the magnification features of the present invention. The present invention may be included in any of various types of systems which are used to display a signal waveform, such as instruments, computer systems, and other devices.

In one embodiment, the magnification features of the present invention are included in an instrument. As used herein, the term "instrument" is intended to include any of various devices which operate to collect data or information from an environment or unit under test and analyze and/or display this information to a user. Examples of various types of instruments include oscilloscopes, digital multimeters, spectrum analyzers, and computer-based measurement systems or virtual instruments, including machine vision systems, image acquisition systems, computer-based data acquisition systems, process control systems, industrial automation systems, etc. The types of information which might be collected and/or displayed by respective instruments include voltage, current, resistance, distance, velocity, pressure, frequency of oscillation, humidity, temperature, image or video data, and audio data, among others.

Thus, one embodiment of the invention comprises an instrument for collecting data and which displays the data to a user. The instrument may comprise an input for receiving data from an environment or unit under test, at least one user input device for receiving user input to the instrument, and a display which displays the data as a signal waveform. The input may be any of various types, such as an analog input, a digital input, a network input, etc. The user input device may be any of various types, such as a pointing device (e.g., a mouse), a keyboard, a touch screen, or physical knobs or buttons (such as in the case of a traditional instrument). The display may also be any of various types.

The instruments in FIGS. 2 and 3 may include various other components, such as a memory which stores received data, and a processor coupled to the memory which performs data analysis and data processing on the data. The memory may also store a software program executable by the processor for implementing the magnification features of the present invention.

The instrument may be operable to display a virtual magnifying symbol (VMS) on the display. In one embodiment, the virtual magnifying symbol appears as a virtual magnifying glass (VMG). However, the virtual magnifying symbol may appear as any symbol or icon, as desired. The virtual magnifying symbol preferably has a region in which magnification occurs, such as a circular region, a rectangular region, or other geometric shape. The virtual magnifying symbol is operable to be positioned over a portion of the signal waveform, such as by using the user input device to position the virtual magnifying symbol on the display. Once the user has positioned the virtual magnifying symbol over a desired portion of the signal waveform, in one embodiment the user may select a magnification option to magnify the portion of the signal waveform on the display. Thus, the portion of the signal waveform may be magnified on the display after or in response to positioning the virtual magnifying symbol over the portion of the signal waveform and selecting the magnification option. Alternatively, the user may simply position the virtual magnifying symbol over the desired portion of the signal waveform, which may automatically cause the portion of the signal waveform on the display covered by the virtual magnifying symbol to be magnified. Thus, the portion of the signal waveform may be magnified on the display after or in response to positioning the virtual magnifying symbol over the portion of the signal waveform, much like the operation of a standard magnifying glass. In one embodiment, the user may also select a desired magnification for the magnified portion of the signal waveform, e.g., 150%, 200%, etc.

Where the portion of the signal waveform being magnified is located at a first location in the signal waveform, the magnified image of this portion is displayed proximate to or at that first location in the signal waveform, e.g., within the context of the signal waveform. In other words, the magnified portion of the signal waveform is displayed proximate to or at this first location in the signal waveform. Thus the virtual magnifying symbol may essentially operate as a "virtual magnifying glass" to magnify a respective portion of the signal waveform when the virtual magnifying symbol or glass is placed over the respective portion of the signal waveform. Thus the user can view the magnified portion (or magnified image of the portion) of the signal waveform in the "context" of the original signal waveform.

Figure 4:
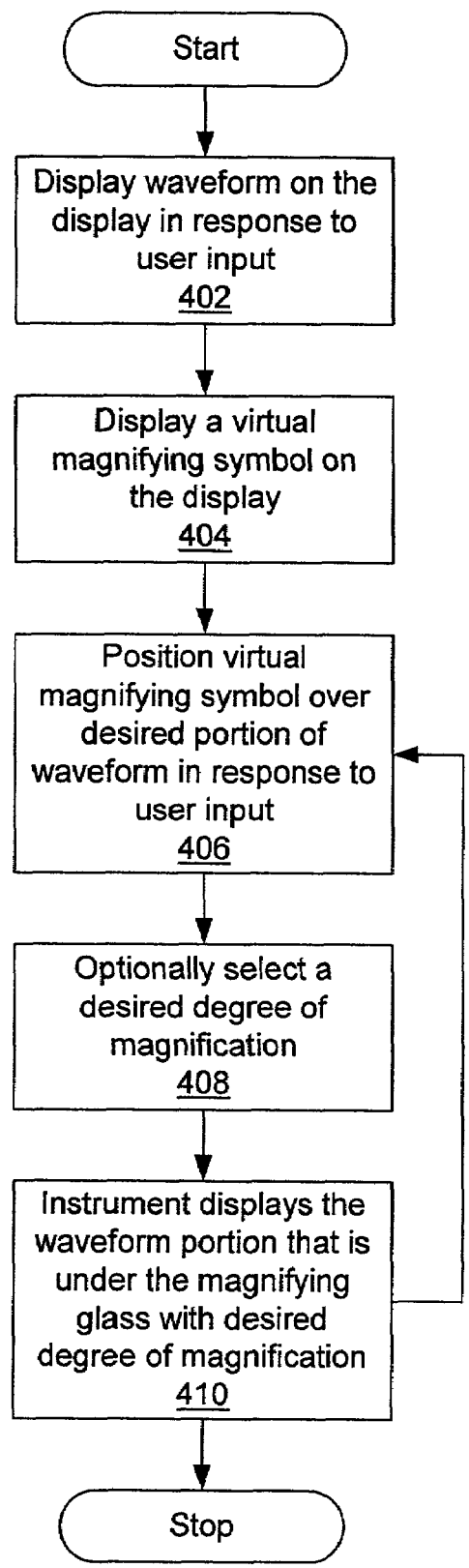
FIG. 4 is a flowchart illustrating a method for magnifying a portion of a signal waveform according to one embodiment of the present invention.

FIG. 4—Operation of the Virtual Magnifying Symbol

FIG. 4 illustrates the operational steps of the virtual magnifying symbol (VMS) function according to one embodiment of the invention.

In step 402 instrument may display a signal waveform on the display. The signal waveform may represent acquired data or characteristics of acquired data. For example, the signal waveform may be a time domain waveform, a frequency domain waveform, or a joint time-frequency waveform. The signal waveform may correspond to a directly measured signal, or to processed data stored in the memory of the instrument, such as spectral data obtained by an FFT.

In step 404 the instrument may display the VMS on the display, e.g., in response to user input. For example, the user may select the VMS from a palette or menu. The display of the VMS signifies that the user has the option to magnify desired portions of the waveform. In one embodiment, the user may size the VMS as desired, i.e., may "grow" or "shrink" the VMS to a desired size. This affects the amount of signal waveform that can be magnified. The user may also select a desired degree of magnification.

In step 406 the user may position the VMS over the desired portion of the waveform, i.e., over the portion of the signal waveform desired to be magnified. For example, the user may use a mouse to drag or position the VMS over the desired portion of the waveform. In one embodiment, the VMS becomes larger in size when the instrument detects user input focused on the VMS function.

In step 408 the user may optionally select a desired degree of magnification. For example, the user may interactively adjust the degree of magnification. The amount of the magnified waveform that is displayed may depend on the size of the virtual lens if the VMS and/or the degree of magnification chosen by the user.

In step 410 the instrument may magnify or "zoom in" on the portion of the waveform that lies within the bounds of the virtual lens of the magnifying glass. Stated another way, the instrument may display an image which is the magnified view of the portion of the signal waveform that lies within the bounds of the virtual lens of the magnifying glass. At this point, the user is able to view a portion of the waveform in great detail while simultaneously viewing this magnified portion in the context of the entire waveform.

In one embodiment, the magnified portion of the waveform is displayed with a greater number of pixels representing more information than was previously displayed. In other words, prior to magnification the waveform portion may be displayed with a small number of pixels due to the small number of pixels that are available on the screen for the displayed portion of the waveform. However, the computer memory may store much greater information regarding this portion of the waveform, some or much of which is not used when the waveform portion is displayed without magnification. When this portion of the waveform is magnified, additional information may be used from the computer memory to display a greater number of pixels on the display, i.e., more of the waveform information can be displayed and is displayed.

The instrument may magnify the portion of the waveform simply in response to the user positioning the VMS over the desired portion of the waveform. Alternatively, the instrument may magnify the portion of the waveform in response to the user positioning the VMS over the desired portion of the waveform and the user selecting a magnification option.

In one embodiment, the entire portion of the waveform that lies within the bounds of the virtual lens of the magnifying glass is magnified. In this embodiment, the "lens" of the VMS encompasses more display area at this step compared to the area encompassed by the VMS lens in its starting position, due to the magnification (and depending on the degree of magnification). However, the larger-sized lens may be set so as not to interfere with the original waveform context, i.e., the remaining portion of the waveform that is not magnified. Therefore, the preferred increase in size will be large enough to provide for proper magnification but not so large as to suppress or occlude a significant portion of the original waveform that is not magnified. In another embodiment, only a subset or portion of the portion of the waveform that lies within the bounds of the virtual lens of the magnifying glass is magnified.

After step 410, the user may interactively adjust the degree of magnification in step 408 and/or reposition the VMS in step 406.

In one embodiment, the user is able to move the VMS along different parts of the waveform and view new magnified portions of the waveform as they come within the bounds of the virtual lens, thus simulating the use of a physical magnifying glass.

Figure 5A:
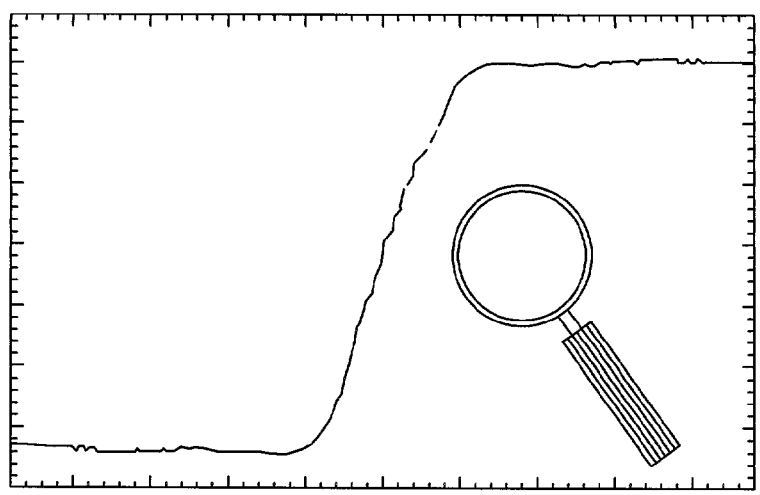
FIG. 5A illustrates one embodiment of an instrument's display with the VMS in its starting position.

FIG. 5A—Virtual Magnifying Symbol on Display Screen

FIG. 5A illustrates an instrument display including the VMS according to one embodiment of the invention. Here it is presumed that a signal waveform is displayed on the display. The VMS may be displayed in a corner of the display screen, which may be its starting position in one embodiment. The VMS may be first displayed in a corner of the display screen so as not to interfere with the user's view of the waveform.

In one embodiment, the VMS is relatively small when it is in its starting position. Therefore it will not interfere with the user's ability to perform other functions on the instrument while at the same time reminding the user that the magnification option is available. In addition, the user has the option to "hide" the VMS at all times during use. This will not affect the user's ability to call upon the magnification function at any time. In another embodiment, the user may "grow" or "shrink" the VMS to a desired size, as mentioned above.

Figure 5B:
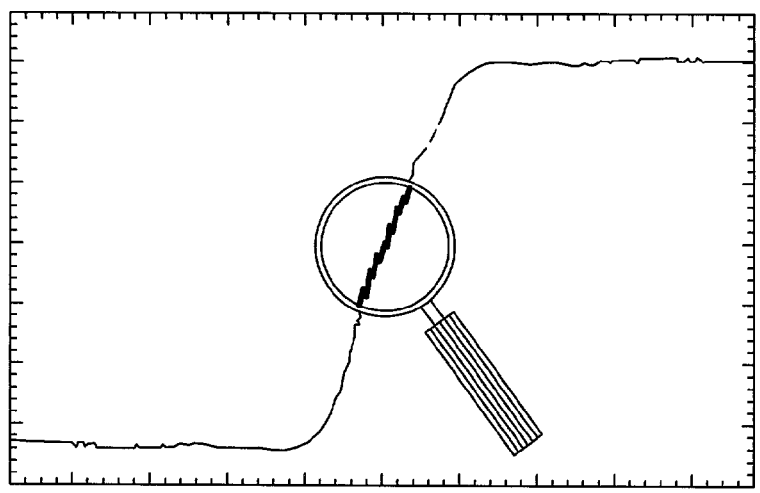
FIG. 5B illustrates the VMS positioned over a portion of the waveform in response to user input, wherein the portion of the waveform is magnified while maintaining the context of the signal waveform.

FIG. 5B—Positioned Virtual Magnifying Symbol

Referring now to FIG. 5B, the user has positioned the VMS over the desired portion of the waveform, and as a result this portion of the displayed waveform has been magnified. In the preferred embodiment, the user achieves this task via a pointing device. The pointing device may be a mouse, digital pen, joystick or touch screen. The user may also position the VMS via physical knobs or buttons.

In one embodiment, the act of magnification may be selected by the user simply positioning the VMS over a portion of the waveform. In other words, the VMS automatically magnifies any portion of the signal waveform that it is moved over, much like a standard physical magnifying glass. The user may choose the magnification setting prior to positioning the VMS, or if the user does not do so, a default setting may be used. In another embodiment, the user may be required to select a magnification option, e.g., may be required to activate the VMS, by selecting a magnification feature, such as by right clicking on the VMS and selecting this option. The user may also select a degree of magnification via the user input device, as discussed above.

In one embodiment, the VMS may optionally become larger in size compared to its original size due to user input triggering the virtual magnification function in some way. These relative sizes are in no way meant to limit the sizes of the VMS's in the final embodiment, but rather serve to illustrate this feature of the present invention.

Figure 5C:
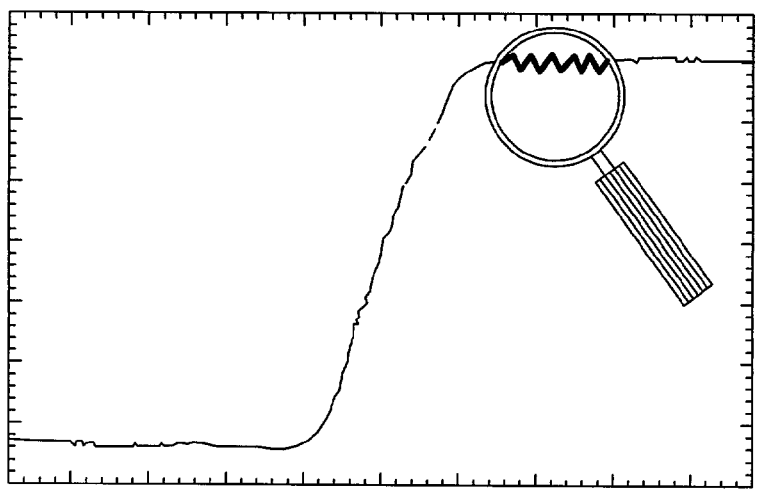
FIG. 5C illustrates the VMS in a second position after having been moved by the user over a different portion of the signal waveform.

FIG. 5C—Magnification by Re-Positioned Virtual Magnifying Symbol

FIG. 5C shows the VMS after it has been re-positioned in response to user input. Re-positioning the VMS may be achieved by repeating the actions used for original positioning. As shown, the user has the option to view new magnified portions of the waveform as the lens boundary moves over the new portions.

In one embodiment, the user may create two or more instances of the VMS to simultaneously view two or more different magnified portions of the signal waveform.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. An instrument for collecting data and which displays the data to a user, comprising:
    a memory for storing the data corresponding to a signal waveform; and
    a display which displays the data as the signal waveform, wherein said display is also operable to display a virtual magnifying symbol;
    wherein the virtual magnifying symbol is operable to be positioned over a portion of the signal waveform and wherein movement of the virtual magnifying symbol during positioning corresponds to movement of at least one user input device;
    wherein the portion of the signal waveform is located at a first location in the signal waveform;
    wherein the portion of the signal waveform is magnified on the display after positioning the virtual magnifying symbol over the portion of the signal waveform;
    wherein the magnified portion of the signal waveform is displayed proximate to the first location in the signal waveform;
    wherein the magnified portion of the signal waveform is displayed within the signal waveform at the first location in the signal waveform and wherein the magnified portion of the signal waveform is displayed within the virtual magnifying symbol as the virtual magnifying symbol is moving in response to the movement of the at least one user input device;
    wherein the instrument comprises a computer system programmed to operate as a virtual instrument.

2. The instrument of claim 1, further comprising:
    the at least one user input device, wherein the user input device is operable to receive user input to position the virtual magnifying symbol on the display.

3. The instrument of claim 2, wherein the at least one user input device is operable to receive user input selecting a magnification option;
    wherein the portion of the signal waveform is magnified on the display in response to positioning the virtual magnifying symbol over the portion of the signal waveform and receiving user input selecting the magnification option.

4. The instrument of claim 2, wherein the at least one user input device is operable to receive user input selecting a degree of magnification for the magnified portion of the signal waveform.

5. The instrument of claim 2, wherein the at least one user input device includes a mouse.

6. The instrument of claim 1, wherein the instrument further comprises a housing having a first side;
    wherein the display is mounted on the first side of the housing;

wherein the instrument further comprises a plurality of user input controls mounted on the first side of the housing.

7. The instrument of claim 6, wherein the plurality of user input controls comprises one or more knobs and one or more buttons.

8. The instrument of claim 1, wherein said virtual magnifying symbol is a magnifying glass symbol.

9. The instrument of claim 1, wherein the instrument is an oscilloscope.

10. The instrument of claim 1, wherein the instrument further comprises:
an input for receiving the data from an environment or unit under test.

11. The instrument of claim 10,
wherein the memory, which stores the data, is coupled to the input;
wherein the instrument further comprises a processor coupled to the memory which performs data analysis and data processing on the data.

12. A method of magnifying a portion of a signal waveform, comprising:
displaying the signal waveform on a display of a computer system;
displaying a virtual magnifying symbol on the display after displaying the signal waveform;
positioning the virtual magnifying symbol over a portion of the signal waveform in response to user input, wherein movement of the virtual magnifying symbol during positioning corresponds to movement of a user input device;
wherein the portion of the signal waveform is located at a first location in the signal waveform; and
displaying a magnified image of the portion of the signal waveform proximate to the first location in response to said positioning;
wherein the magnified image of the portion of the signal waveform is displayed within the signal waveform at the first location in the signal waveform and wherein the magnified image is displayed within the virtual magnifying symbol as the virtual magnifying symbol is moving in response to the movement of the user input device.

13. The method of claim 12, further comprising:
receiving user input selecting a magnification option;
wherein said displaying the magnified image of the portion of the signal waveform is performed in response to positioning the virtual magnifying symbol over the portion of the signal waveform and receiving user input selecting the magnification option.

14. The method of claim 12, further comprising:
receiving user input selecting a degree of magnification for the magnified portion of the signal waveform;
wherein the portion of the signal waveform is displayed with the selected degree of magnification.

15. The method as defined by claim 12, further comprising:
moving the virtual magnifying symbol along additional portions of the signal waveform;
magnifying the additional portions of the signal waveform as the user moves the virtual magnifying symbol; and
displaying the magnified additional portions of the signal waveform.

16. The method as defined by claim 12, wherein said virtual magnifying symbol is a magnifying glass symbol.

17. An instrument for collecting data and which displays the data to a user, comprising:
a pointing device;
a memory for storing data corresponding to a signal waveform; and
a display which displays the data as the signal waveform, wherein said display is also operable to display a virtual magnifying symbol;
wherein the virtual magnifying symbol is operable to be positioned over a portion of the signal waveform in response to user input received through the pointing devices, wherein movement of the virtual magnifying symbol during positioning corresponds to movement of the pointing device;
wherein, in response to positioning the virtual magnifying symbol over the portion of the signal waveform, the portion of the signal waveform is magnified within the original waveform and wherein the portion of the signal waveform is magnified and displayed within the virtual magnifying symbol as the virtual magnifying symbol is moving in response to the movement of the pointing device.

18. The instrument of claim 17, wherein the virtual magnifying symbol operates as a virtual magnifying glass.

19. The instrument of claim 17,
wherein the portion of the signal waveform is located at a first location in the signal waveform;
wherein the portion of the signal waveform is magnified on the display after positioning the virtual magnifying symbol over the portion of the signal waveform;
wherein the magnified portion of the signal waveform is displayed proximate to the first location in the signal waveform.

20. The instrument of claim 19, wherein the magnified portion of the signal waveform is displayed at the first location in the signal waveform.

21. The instrument of claim 19, wherein the magnified portion of the signal waveform is displayed within the signal waveform at the first location in the signal waveform.

22. The instrument of claim 17, wherein the instrument is further operable to receive user input selecting a magnification option;
wherein the portion of the signal waveform is magnified on the display in response to positioning the virtual magnifying symbol over the portion of the signal waveform and receiving user input selecting the magnification option.

23. The instrument of claim 17, wherein the instrument is further operable to receive user input selecting a degree of magnification for the magnified portion of the signal waveform.

24. The instrument of claim 17, further comprising
an input for receiving the data from an environment or unit under test.

25. The instrument of claim 17, wherein the pointing device is a mouse, a digital pen, or a touch screen.

* * * * *